United States Patent
Ashraf et al.

(10) Patent No.: US 11,094,381 B2
(45) Date of Patent: Aug. 17, 2021

(54) RAPID RESTART PROTECTION FOR A NON-VOLATILE MEMORY SYSTEM

(71) Applicant: Apple Inc., Cupertino, CA (US)

(72) Inventors: Muhammad N. Ashraf, San Jose, CA (US); Alexander Paley, Cupertino, CA (US); Yuhua Liu, Belmont, CA (US); Vadim Khmelnitsky, Foster City, CA (US); Matthew J. Byom, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/429,021

(22) Filed: Jun. 2, 2019

(65) Prior Publication Data
US 2020/0381060 A1 Dec. 3, 2020

(51) Int. Cl.
*G11C 16/22* (2006.01)
*G11C 16/16* (2006.01)
*G11C 7/10* (2006.01)
*G06F 1/30* (2006.01)

(52) U.S. Cl.
CPC .............. *G11C 16/22* (2013.01); *G06F 1/30* (2013.01); *G11C 7/109* (2013.01); *G11C 16/16* (2013.01)

(58) Field of Classification Search
CPC .......... G11C 16/22; G11C 16/16; G11C 7/109; G06F 1/30
See application file for complete search history.

(56) References Cited

U.S. PATENT DOCUMENTS

| | | | |
|---|---|---|---|
| 2003/0099134 A1* | 5/2003 | Lasser | G11C 16/20 365/185.29 |
| 2007/0276939 A1* | 11/2007 | Funato | G06F 11/0724 709/224 |
| 2010/0174845 A1* | 7/2010 | Gorobets | G06F 12/0246 711/103 |
| 2010/0174869 A1* | 7/2010 | Gorobets | G06F 12/1027 711/135 |
| 2013/0067146 A1* | 3/2013 | Zettsu | G06F 12/0246 711/103 |

* cited by examiner

*Primary Examiner* — David Yi
*Assistant Examiner* — Zubair Ahmed
(74) *Attorney, Agent, or Firm* — Dickinson Wright RLLP

(57) ABSTRACT

Systems and methods for managing non-volatile memory devices are provided. Embodiments discussed herein provide rapid restart protection for journaling system. The rapid restart protection prevents the NVM from experiencing memory saturation when the NVM system is being forced to handle multiple successive restarts.

20 Claims, 8 Drawing Sheets

RAPID RESTART PROTECTION FOR A NON-VOLATILE MEMORY SYSTEM

TECHNICAL FIELD

This patent specification generally relates to non-volatile memory devices, and more particularly, to rapid restart protection.

BACKGROUND

Various types of non-volatile memory ("NVM"), such as flash memory (e.g., NAND flash memory and NOR flash memory), can be used for mass storage. For example, consumer electronics (e.g., portable media players) use flash memory to store data, including music, videos, images, and other types of information. Devices that use the NVM can sometimes experience sudden power failure. This type of power failure is unexpected and requires additional processing steps during restart. When the sudden power failure is repeated in a rapid and continuously fashion, the resulting rapid restarts can potentially become problematic for the NVM. Accordingly, what are needed system and methods for providing rapid restart protection for the NVM.

SUMMARY

Systems and methods for managing non-volatile memory devices are provided. Embodiments discussed herein provide rapid restart protection for a non-volatile memory system. The rapid restart protection prevents the NVM from experiencing potential issues when the NVM system is being forced to handle multiple successive restarts. The rapid restart protection can be implemented by writing a rapid restart key or flag to a content log in the NVM to serve as an indicator to the NVM system that the prior restart sequence was not successful. The NMV system, upon detecting presence of the rapid restart key, can take preventive measures that protect the NVM. For example, the NVM system can erase portions of the NVM that were written in connection with the rapid restart key to prevent memory usage saturation.

In one embodiment, a method implemented in a system including non-volatile memory (NVM) is provided. The method can include writing content log (CLOG) data to the NVM; writing indirection data to the NVM, wherein the indirection data is distributed across a first plurality of silos stored in the NVM, wherein the first plurality of silos are updated with the indirection data on a recurring circular basis; and in response to a restart event, performing rapid restart protection. The rapid restart protection can include holding off host write transactions; replaying the CLOG to determine if a rapid restart key exist. If the rapid restart key does exist, erasing all NVM bands opened and written to in connection with the rapid restart key. If the rapid restart key does not exist or if all the NVM bands opened and written to in connection with the rapid restart key have been erased: opening a new CLOG band; writing the rapid restart key to a start of the new CLOG band; opening at least one indirection band; and copying the first plurality of silos to a second plurality of silos in the at least one indirection band. The method can enable host write transactions when the first plurality of silos is fully copied to the second plurality of silos.

In another embodiment, a system is provided that can include a non-volatile memory (NVM), and control circuitry operative to write content log (CLOG) data to the NVM, and write indirection data to the NVM, wherein the indirection data is distributed across a first plurality of silos stored in the NVM, wherein the first plurality of silos are updated with the indirection data on a recurring circular basis. In response to a restart event, the control circuitry can perform rapid restart protection by holding off host write transactions, replaying the CLOG to determine if a rapid restart key exist. If the rapid restart key does exist, erasing all NVM bands opened and written to in connection with the rapid restart key. If the rapid restart key does not exist or if all the NVM bands opened and written to in connection with the rapid restart key have been erased: opening a new CLOG band; writing the rapid restart key to a start of the new CLOG band; opening at least one indirection band; and copying the first plurality of silos to a second plurality of silos in the at least one indirection band. The control circuitry can enable host write transactions when the first plurality of silos is fully copied to the second plurality of silos.

In yet another embodiment, a method implemented in a system including non-volatile memory (NVM) is provided. The method can include resetting a rapid restart counter; and in response to restart event: incrementing the rapid restart counter; commencing a failure protocol if the rapid restart counter exceeds a first threshold; starting a rapid restart protection process when the rapid restart counter is less than a second threshold and is less than the first threshold, wherein the first threshold is greater than the second threshold; and delaying the rapid restart protection process for a fixed period of time when the rapid restart counter exceeds a second threshold and is less than the first threshold.

A further understanding of the nature and advantages of the embodiments discussed herein may be realized by reference to the remaining portions of the specification and the drawings.

DETAILED DESCRIPTION

In the following detailed description, for purposes of explanation, numerous specific details are set forth to provide a thorough understanding of the various embodiments described herein. Those of ordinary skill in the art will realize that these various embodiments are illustrative only and are not intended to be limiting in any way. Other embodiments will readily suggest themselves to such skilled persons having the benefit of this disclosure.

In addition, for clarity purposes, not all of the routine features of the embodiments described herein are shown or described. One of ordinary skill in the art would readily appreciate that in the development of any such actual embodiment, numerous embodiment-specific decisions may be required to achieve specific design objectives. These design objectives will vary from one embodiment to another and from one developer to another. Moreover, it will be appreciated that such a development effort might be complex and time-consuming, but would nevertheless be a routine engineering undertaking for those of ordinary skill in the art having the benefit of this disclosure.

Figure 1:
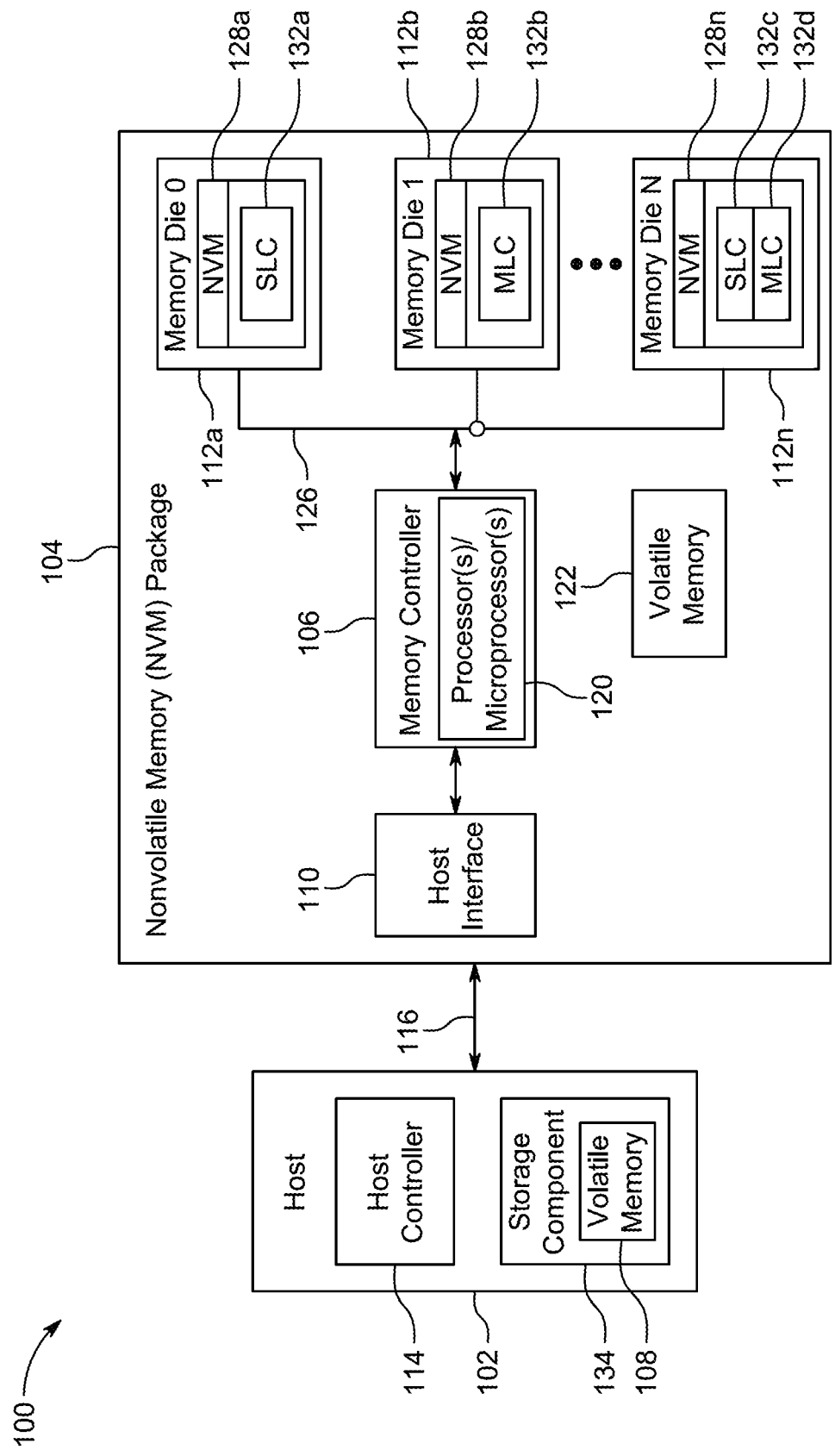
FIG. 1 is a diagram depicting an illustrative system that includes a host and an NVM package with a memory controller, according to various embodiments.

FIG. 1 is a diagram depicting system 100, including NVM package 104 and host 102. Host 102 may be configured to provide memory access requests (e.g., read, write, and erase commands) to NVM package 104, which can include memory controller 106, host interface 110, and NVM dies 112 *a-n* with corresponding NVMs 128 *a-n*.

Host 102 can be any of a variety of host devices and/or systems, such as a portable media player, a cellular telephone, a pocket-sized personal computer, a personal digital assistant ("PDA"), a desktop computer, a laptop computer, and/or a tablet computing device. NVM package 104 can include NVMs 128 *a-n* (e.g., in NVM dies 112 *a-n*) and can be a ball grid array package or other suitable type of integrated circuit ("IC") package. NVM package 104 can be part of and/or separate from host 102. For example, host 102 can be a board-level device and NVM package 104 can be a memory subsystem that is installed on the board-level device. In other embodiments, NVM package 104 can be coupled to host 102 with a wired (e.g., SATA) or wireless (e.g., Bluetooth™) interface.

Host 102 can include host controller 114 that is configured to interact with NVM package 104. For example, host 102 can transmit various access requests, such as read, write, and erase commands, to NVM package 104. Host controller 114 can include one or more processors and/or microprocessors that are configured to perform operations based on the execution of software and/or firmware instructions. Additionally or alternatively, host controller 114 can include hardware-based components, such as application-specific integrated circuits ("ASICs"), that are configured to perform various operations. Host controller 114 can format information (e.g., commands and/or data) transmitted to NVM package 104 according to a communications protocol shared between host 102 and NVM package 104.

Host 102 can include volatile memory 108. Volatile memory 108 can be any of a variety of volatile memory types, such as cache memory or RAM. Host 102 can use volatile memory 108 to perform memory operations and/or to temporarily store data that is being read from and/or written to NVM package 104. For example, volatile memory 108 can temporarily store a set of access requests to be sent to, or to store data received from, NVM package 104.

Host 102 can communicate with NVM package 104 over communications channel 116 using host interface 110 and memory controller 106. Communications channel 116 can be any bus suitable for bidirectional communications. Communications channel 116 can be fixed, detachable, or wireless. Communications channel 116 can be, for example, a universal serial bus (USB), serial advanced technology (SATA) bus, or any other suitable bus.

Memory controller 106 can include one or more processors and/or microprocessors 120 that are configured to perform operations based on the execution of software and/or firmware instructions. Additionally or alternatively, memory controller 106 can include hardware-based components, such as ASICs, that are configured to perform various operations. Memory controller 106 can perform a variety of operations, such as dispatching commands issued by host 102.

Host controller 114 and memory controller 106, alone or in combination, can perform various memory management functions, such as garbage collection and wear leveling. In implementations where memory controller 106 is configured to perform at least some memory management functions, NVM package 104 can be termed "managed NVM" (or "managed NAND" for NAND flash memory). This can be in contrast to "raw NVM" (or "raw NAND" for NAND flash memory), in which host controller 114, external to NVM package 104, performs memory management functions for NVM package 104. In some embodiments, NVM package 104 can be termed a solid state drive (SSD).

In some embodiments, host controller 114 and memory controller 106 can be part of the same memory device. Although there can be overlap, host controller 114 and memory controller 106 can perform different roles. For example, host controller 114 may perform and provide user-facing functionality for the memory device, such as performing operations to provide a user interface and responding to user input (e.g., requests to play a particular media file). Memory controller 106 may perform and provide memory-based functionality for the memory device, such as implementing memory access requests from host controller 114 (e.g., converting from logical to physical addressing), performing memory management operations, and/or performing ECC operations.

As depicted in FIG. 1, memory controller 106 can be incorporated into the same package as NVM dies 112 *a-n*. In other embodiments, memory controller 106 may be physically located in a separate package or in the same package as host 102. In some embodiments, memory controller 106 may be omitted, and all memory management functions that are normally performed by memory controller 106 (e.g., garbage collection and wear leveling) can be performed by a host controller (e.g., host controller 114). Memory controller 106 or host 102 can include a flash translation layer (FTL) for maintaining a logical-to-physical mapping.

NVM package 104 may include volatile memory 122. Volatile memory 122 can be any of a variety of volatile memory types, such as cache memory or RAM. Memory controller 106 can use volatile memory 122 to perform access requests and/or to temporarily store data that is being read from and/or written to NVMs 128 *a-n* in NVM dies 112 *a-n*. For example, volatile memory 122 can store firmware and memory controller 106 can use the firmware to perform operations on NVM package 104 (e.g., read/program operations). In some embodiments, volatile memory 122 can be included within memory controller 106.

Memory controller 106 can use shared internal bus 126 to access NVMs 128 *a-n* and can use NVMs 128 *a-n* to persistently store a variety of information, such as debug logs, instructions, and firmware that NVM package 104 uses to operate. Although only one shared internal bus 126 is depicted in NVM package 104, an NVM package can include more than one shared internal bus. Each internal bus can be connected to multiple (e.g., 2, 3, 4, 8, 32, etc.) memory dies as depicted with regard to NVM dies 112 *a-n*. NVM dies 112 *a-n* can be physically arranged in a variety of configurations, including a stacked configuration, and may be, according to some embodiments, integrated circuit ("IC") dies.

NVMs 128 *a-n* can be any of a variety of NVM, such as NAND flash memory based on floating gate or charge trapping technology, NOR flash memory, erasable programmable read only memory ("EPROM"), electrically erasable programmable read only memory ("EEPROM"), ferroelectric RAM ("FRAM"), magnetoresistive RAM ("MRAM"), phase change memory ("PCM"), or any combination thereof. In one embodiment, NVMS 128a-n can be three-dimensional (3D) Nand. 3D Nand improves on regular two-dimensional storage by stacking storage cells in increase capacity through higher density, lower cost per gigabyte, and provides reliability, speed, and performance expected of solid-state memory. MLC refers to programming multiple bits per cell, whereas single cell mode (SLC) refers to programming one bit per cell. In some embodiments, a subset of MLC can be a 2-bit cell, which can be programmed with two bits per cell. In other embodiments, a subset of MLC can be a three level cell (TLC), which can be programmed with three bits per cell.

NVMs 128 a-n can be organized into "blocks", which can the smallest erasable unit, and further organized into "pages", which can be the smallest unit that can be programmed or read. In some embodiments, NVMs 128 a-n can include multiple integrated circuits or dies, where each integrated circuit may have multiple blocks. Memory locations (e.g., blocks or pages of blocks) from corresponding integrated circuits may form "super blocks". Each memory location (e.g., page or block) of NVMs 128 a-n can be referenced using a physical address (e.g., a physical page address or physical block address). Memory locations (e.g., blocks or pages of blocks) from corresponding integrated circuits may be logically grouped together to form "bands". Bands can provide operational parallelism, thereby enabling programming, reading, and erase operations to be performed in parallel for blocks located on different integrated circuits. Each memory location of NVMs 128a-n can be referenced using a physical address (e.g., a physical page address or physical block address). In one embodiment, a stripe can refer to a multi-plane page taken from multiple dies (e.g., all dies). A band can refer to a multi-plane block taken from multiple dies (e.g., all dies). For example a band can span each plane of each die in the NVM.

Figure 2:
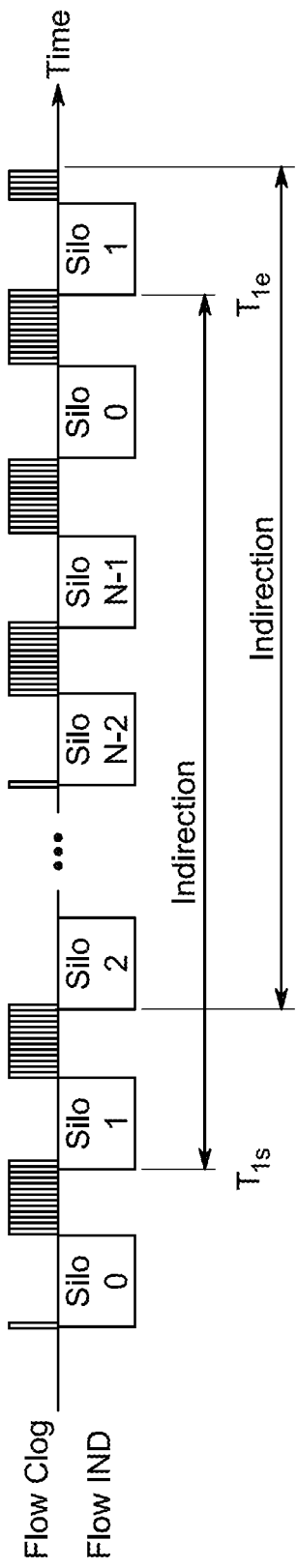
FIG. 2 shows an illustrative write sequence according to an embodiment.

FIG. 2 shows an illustrative write sequence according to an embodiment. The write sequence of FIG. 2 shows two different flows of data being written to the NVM: content LOG (CLOG) flow and indirection data flow. The CLOG can be a chronological journal of all transaction information related to changes of the NVM. The CLOG can be accessed during NVM mount time to bring the NVM to a coherent state prior to use. Each vertical line in the flow CLOG represents a transaction entry into the CLOG. For example, one vertical line may represent that a chunk of indirection data has been written, another vertical line may represent that a garbage collection operation has been performed, and yet another vertical line may represent host transactions. The indirection data can represent the logical to physical mapping of the entire NVM. The entirety of the logical to physical mapping (i.e., the indirection data) is stored in the NVM, and is continuously updated as part of routine NVM operation. In embodiments discussed herein, the indirection data is stored in multiple chunks of data, called silos, in the NVM. For purposes of explanation, assume that there are 64 silos of equal size and that the indirection data is distributed across all 64 silos. Storing the indirection data in all 64 silos as opposed to storing the indirection data in one large chunk of data on the NVM enables the NVM system to distribute the write time required to save the entire logical to physical mapping table to the NVM. This can lessen the impact on the host system, which may otherwise desire to access the NVM, but cannot because the indirection data is being written. That is, if the content equivalent to all 64 silos is written in one chunk, this may have a higher likelihood of affecting the host system than distributing the indirection data across all 64 silos.

The silos are updated in a circular recurring fashion. That is, the direction data is stored in silo 0, then silo 1, then silo 2, and so until silo 63 is programmed with indirection data. After silo 63 is programmed, storage of indirection data loops back to silo 0. This is shown in FIG. 2, where the entirety of the indirection data is stored in between the start of silo 1 at timestamp t1s, and the start of the next silo 1 at timestamp t1e.

When a device is booted up, the NVM system can reconstruct the logical to physical mapping of the NVM by accessing the last set of silos (e.g., the previously written 64 silos) stored in the NVM. The NVM system may engage in a process sometimes referred to as replay to reconstruct the mapping. In response to the replay accesses the CLOG and the silos to reconstruct the mapping. During a "normal" shutdown event in which the NVM system is notified that a shutdown event is imminent, the NVM system is provided with sufficient time to update the necessary number of silos with the indirection data. This can ensure clean boot on start up and that replay can be performed without issue. During an "unexpected" shutdown event such as a sudden power failure, the NVM system is not provided with sufficient time to update the necessary number of silos. During replay in response to an unclean boot, the NVM system cannot trust the previously copied silos and therefore required to copy each silo to a new location (e.g., a new band or a set of new bands) as part the mapping reconstruction. In addition, CLOG data may be accessed to update one or more silos as appropriate to account for any transactions that occurred after the last silo was stored in NVM. If all silos are successfully copied, the NVM can be considered mounted and ready for use, and the old copy of the silos can be marked for deletion. However, if unexpected shutdown events and subsequent rapid restarts continue to persist while the NVM system is attempting to complete replay by copying the silos and integrating CLOG data, this can potentially lead to a storage space issue for the NVM. This issue is now discussed in connection with FIG. 3.

Figure 3:
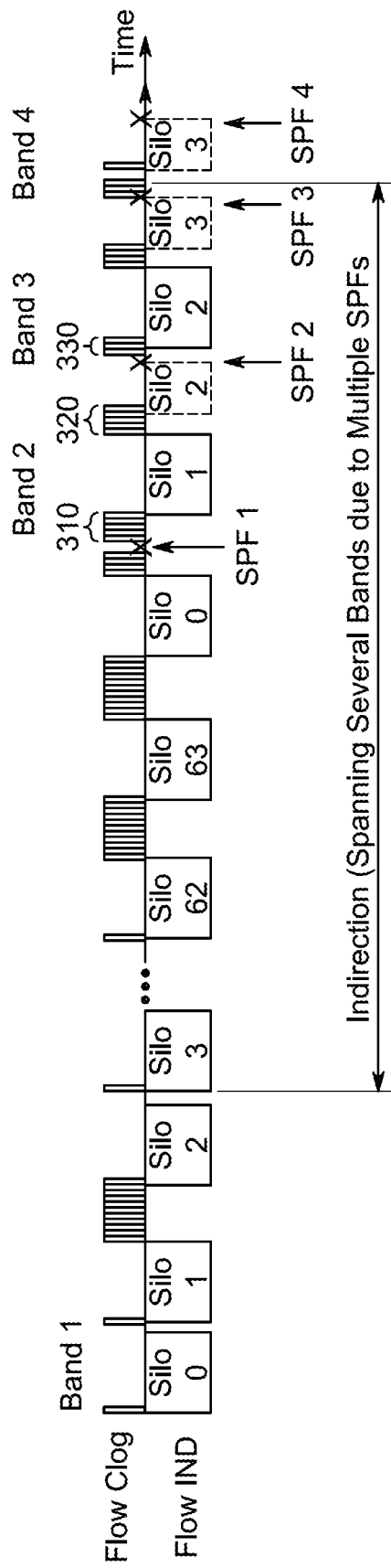
FIG. 3 illustrates a conventional timing diagram showing CLOG and indirection data flows.

FIG. 3 illustrates a conventional timing diagram showing CLOG and indirection data flows. FIG. 3 shows CLOG data and indirection data being written to the NVM (in band 1) and then sudden power failure (SPF) event 1 occurs. Subsequent SPF1, the system reboots and a few host transactions 310 occur before the system is able to open a new band (band 2) to start copying the old silos. As shown, silo 1 is copied, additional host transactions 320 occur, and silo 2 is partially copied before SPF2 occurs. Following SPF2, the system reboots, opens a new band (band 3), processes host transaction 330 and copies silo 2. Following the completed copy of silo 2, additional transactions 340 are written to the NVM and silo 3 is partially copied before SPF3 occurs. At the occurrence of SPF3, the system has opened two new bands, bands 2 and 3, and now opens new band 4 and attempts to copy silo 3, but is interrupted by SPF4. As a result, there are now three open new bands (2-4) and band 1 has old silos 0-2, but band 1 cannot be deleted until all 64 silos are copied. If the sudden power failures persist, the system may be forced to open many new bands without having the ability to delete any of them. This runaway issue of opening new bands can cause the NVM system or the host system using the NVM system to brick itself.

Figure 4:
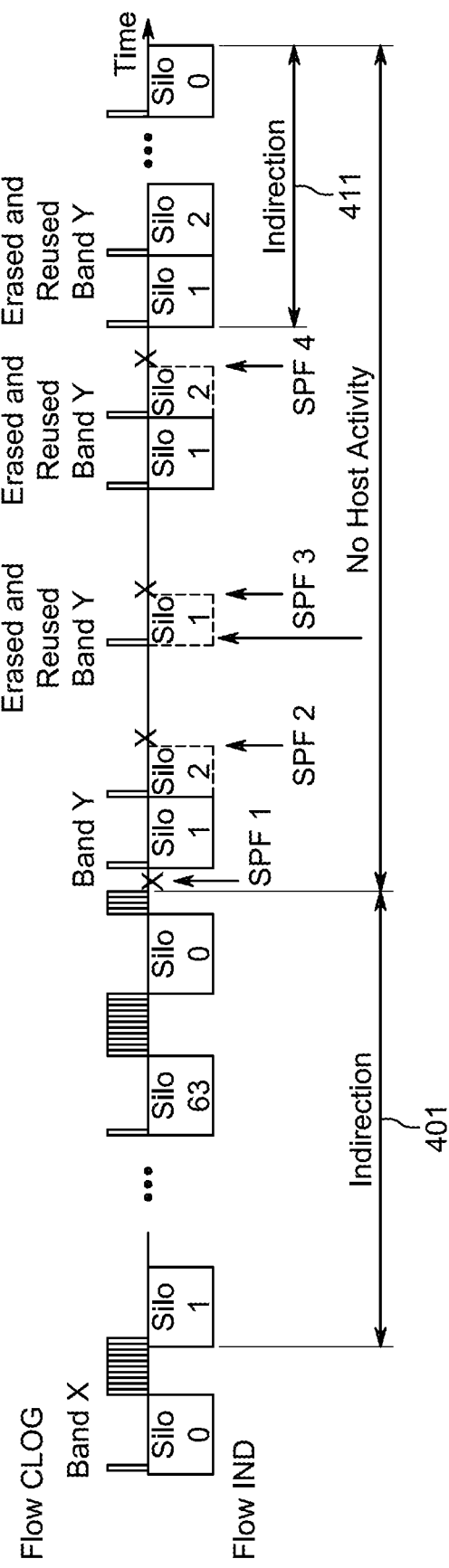
FIG. 4 illustrates a timing diagram of rapid restart protection according to an embodiment.

FIG. 4 illustrates a timing diagram of how rapid restart protection according to embodiments discussed herein can prevent new band runaway. Rapid restart protection can operate generally as follows. In response to an unclean boot (e.g., caused by a sudden power failure), the system can attempt to copy all silos without allowing any updates to the indirection data. That is, no host transactions are permitted when the NVM system is attempting to copy the silos. In addition, the original copy of the silos and any CLOG updates thereof must be preserved until all silos have been copied. If a sudden power failure occurs during the silo copying process, all new bands that were opened during the previous boot are erased and set free for use in a subsequent silo copying process. This avoids the runaway new band problem discussed above in connection with FIG. 3.

The entirety of the indirection data is stored in silos 1-63 and silo 0 existing after silo 63, as illustrated by indirection span 401. SPF1 event occurs after silo 0 has been written to the NVM. On reboot in response to SFP1, new band Y is opened and silo 1 (from band X) is copied. In addition, on reboot in response to SFP1, no host transactions are permitted. Silo 2 is partially copied and is interrupted by SPF2. On reboot in response to SPF2, band Y is erased and is reused for copying the silos from band X. Silo 1 is partially copied but is interrupted by SPF3. On reboot in response to SPF3, band Y is erased again and reused for copying silos from band X. Silo 1 is copied, but SPF4 prevents silo 2 from being copied. On reboot in response to SPF4, band Y is erased again and reused for copying the silos. In connection with this last reboot, all 64 silos are successfully copied as evidence by indirection span 411. Now, the silos in band X can be marked for deletion and host transactions can start.

Figure 5A:
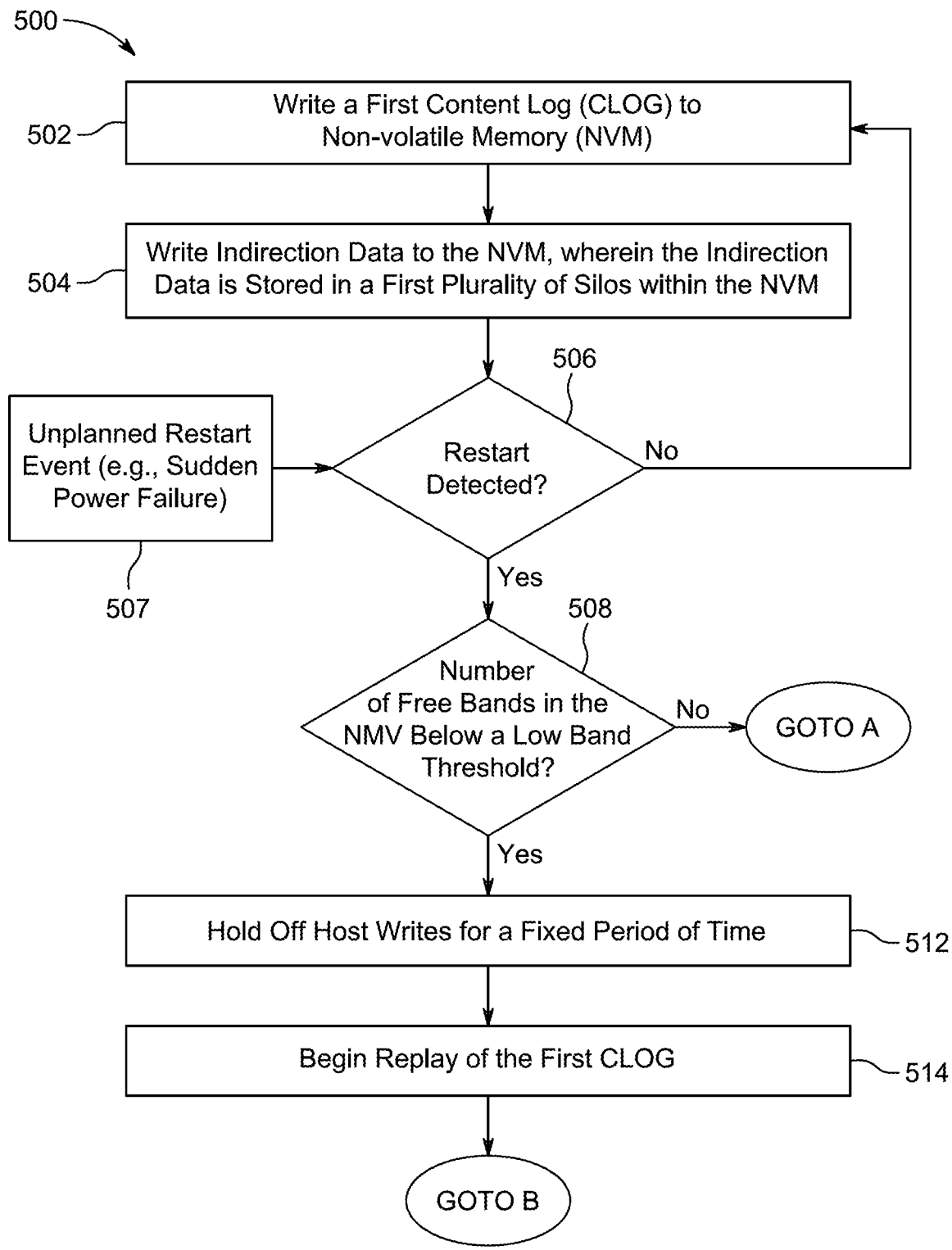
FIGS. 5A-5C show an illustrative process for providing rapid restart protection according to an embodiment.
Figure 5B:
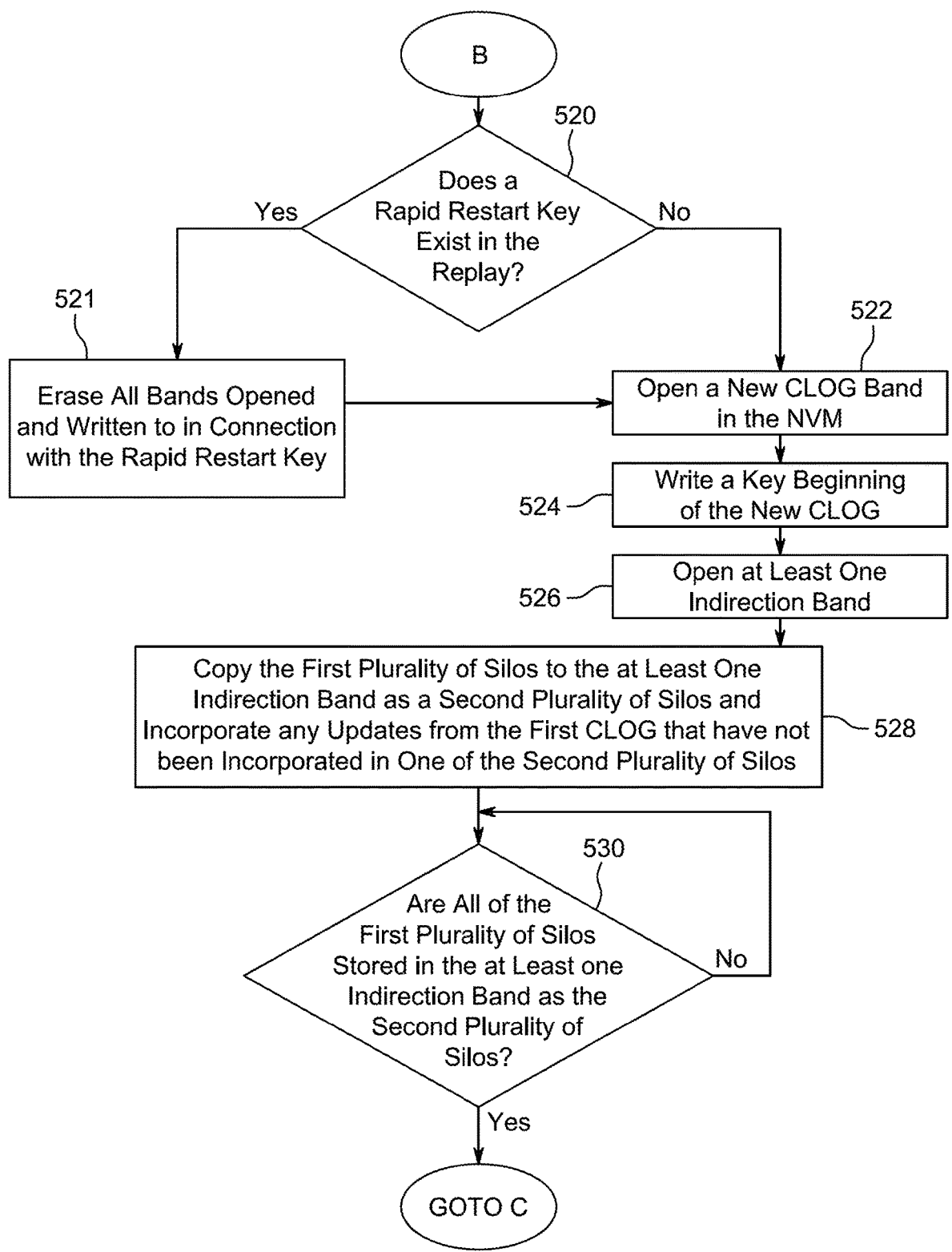
Figure 5C:
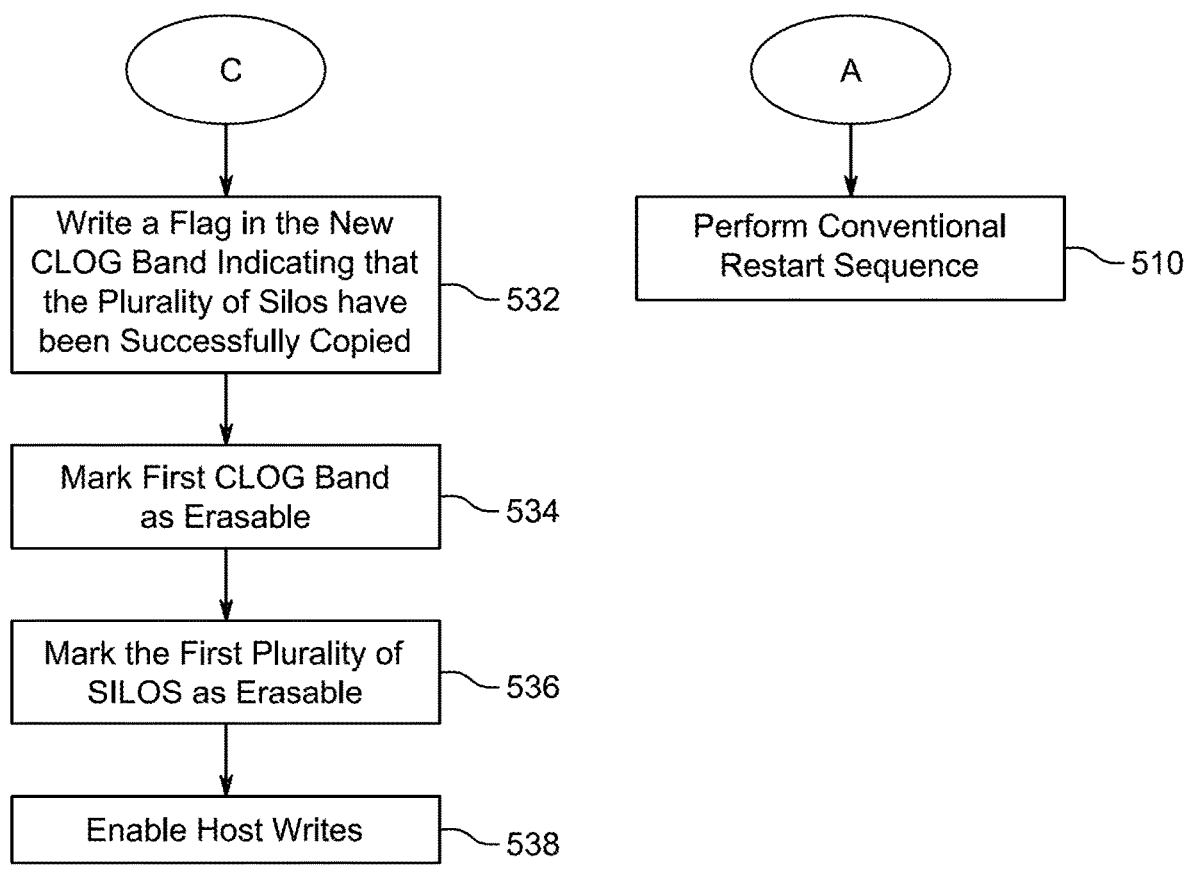
Figure 6:
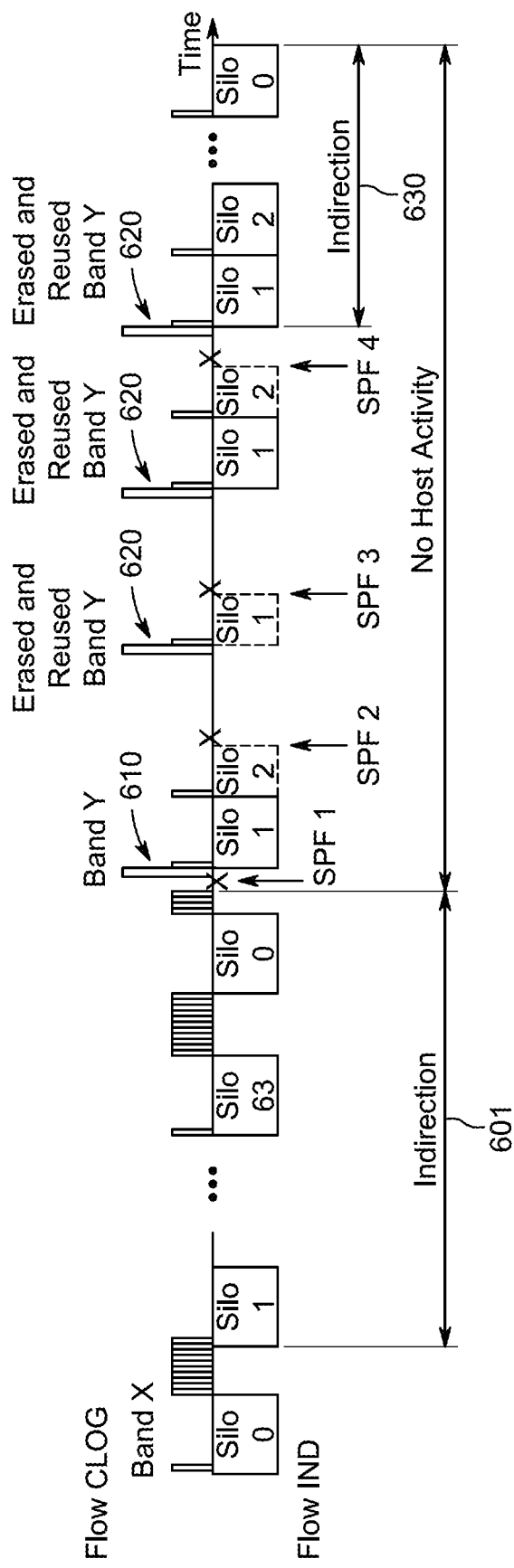
FIG. 6 illustrates a timing diagram of how rapid restart protection is implemented according to an embodiment.

FIGS. 5A-5C show an illustrative process 500 for providing rapid restart protection according to an embodiment. Process 500 is discussed in connection with the timing diagram of FIG. 6. FIG. 6 illustrates a timing diagram of how rapid restart protection is implemented according to an embodiment. Process 500 may begin at step 502 by writing a first content log to NVM and by writing indirection data to the NVM, as indicated by step 504. As explained above, the indirection data may be stored in fixed number of silos that are updated on a circular repeating basis. At step 506, a determination is made as to whether a restart event has been detected. A restart event can be a planned restart such as user directed power down event or it can be unplanned restart event such as sudden power failure, as shown in step 507. If the determination at step 506 is NO, process 500 can return to step 502. If the determination is YES, process 500 can proceed to step 508, where process 500 can determine whether the number of free bands in the NVM is below a low band threshold. If the NVM has sufficient free space, and the determination at step 508 is NO, process 500 can proceed to step 510 and can perform a conventional restart sequence. The conventional restart process does not use the rapid restart protection process according to embodiments discussed herein. In some embodiments, if the number of free bands is less than the number of required bands to copy all the silos (i.e., less than the number of bands needed to perform successful rapid restart protection—this threshold is less than the low band threshold), process 500 may proceed directly to a conventional restart at step 510, thereby bypassing rapid restart protection according to embodiments discussed herein.

If the determination at step 508 is YES, this can indicate that the NVM is relatively low on space and potentially susceptible to being bricked if the rapid restart protection process according to embodiments discussed herein is not implemented. Process 500 can start the rapid restart protection process at step 512 by holding off host transactions (e.g., host writes) indefinitely until all silos containing the indirection data are successfully copied and updated with the relevant CLOG data. At step 514, the replay of the first CLOG can begin. Referring briefly to FIG. 6, replay of the first CLOG can begin after SPF1.

Process 500 can determine whether a rapid restart key exists in the CLOG during replay, as step 520. The rapid restart key or flag can serve as a marker to indicate that the system has restarted before was not able to fully copy all silos. If the determination at step 520 is NO, process 500 can open a new band (e.g, a new CLOG band) at step 522 and the key may be written to a beginning of the new band (e.g., the new CLOG band), at step 524. For example, the rapid restart key may be written in the first page of the new band at the start of silo copying process. FIG. 6 shows that key 610 is written at the beginning of band Y as part of the reboot in response to SPF1. At step 526, at least one indirection band is opened. The first plurality of silos (as illustrated by indirection 601) is copied to the at least one indirection band as a second plurality of silos and any updates from the first CLOG that have not been incorporated into the second plurality of silos are also incorporated into at least one of the second plurality of silos. For example, referring to FIG. 6, the transactions in the first CLOG that were executed after silo 0 was written represent update information that needs to be incorporated into the second plurality of silos (illustrated by indirection 630).

If the determination at step 520 is YES, all bands opened and written to in connection with the rapid restart key are erased and set as free, at step 521. The rapid restart key is also erased at step 521. Referring to FIG. 6, on replay, the system will see key 610 and know that band Y should be erased. Following step 521, process 500 can proceed to step 522 (as discussed above). The new band opened at step 522 may include the same band that was erased at step 521 or it can be another band. Referring to FIG. 6, band Y is erased and a new band Y is opened, and new key 620 is written, and silo 1 is partially copied before it is interrupted with SPF3 begin being copied.

At step 530, a determination is made as to whether the first plurality of silos are stored in the at least one indirection band as the second plurality of silos. If NO, process 500 loops back to step 530. If YES, process 500 can write a flag in the new CLOG band indicating that the first plurality of silos have been successfully copied (step 532). The first CLOG can be marked as erasable (step 534) and the first plurality of silos can be marked as erasable (step 536). Host transactions or host writes can be enabled at step 538. In FIG. 6, steps, 532, 534, and 536 can be performed after the second plurality of silos are fully copied (indirection data 630).

It should be appreciated that the steps shown in FIG. 5 are merely illustrative and that additional steps may be added, some steps may be omitted, and the order of the steps can be changed.

Figure 7:
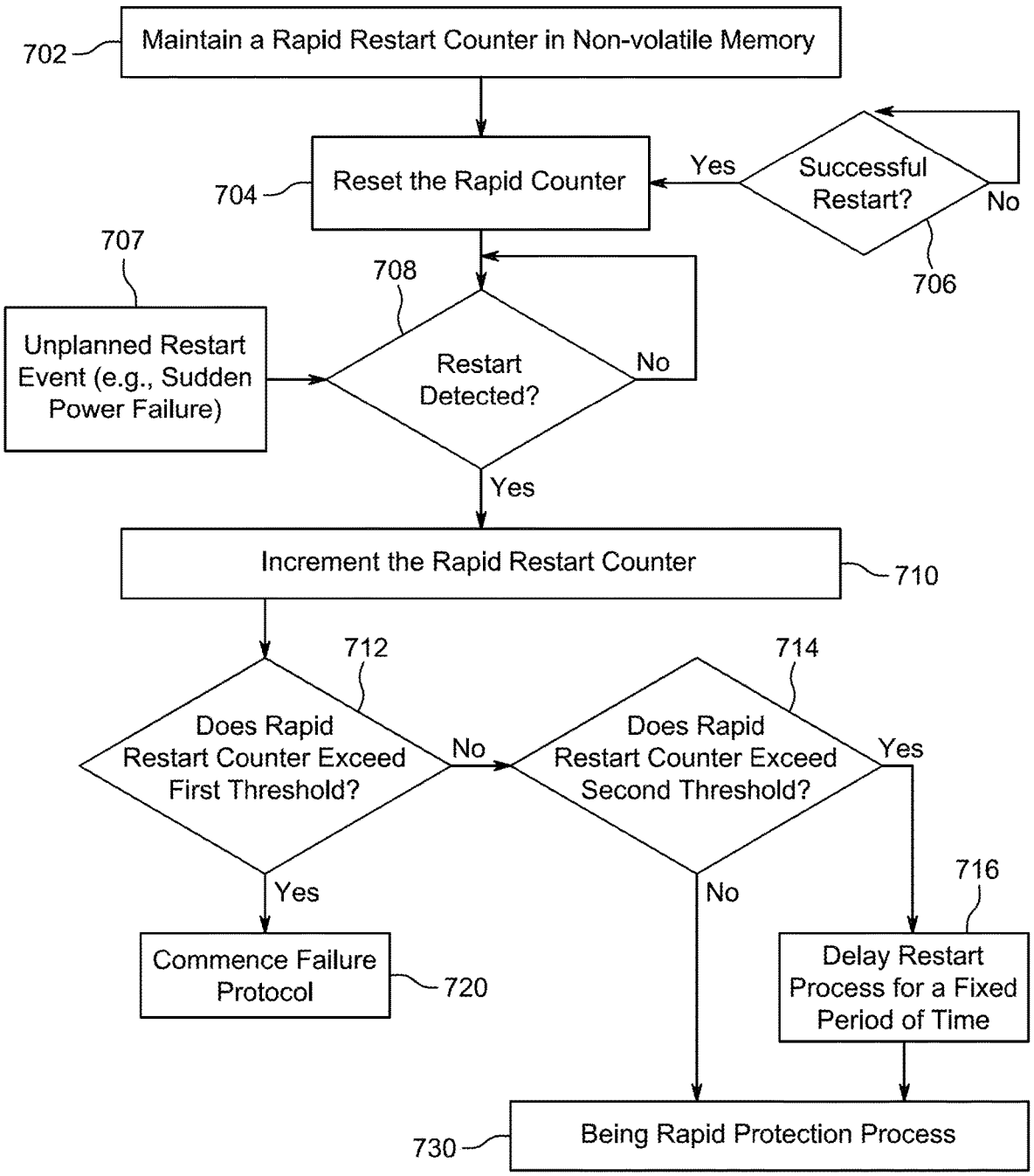
FIG. 7 shows an illustrative process according to an embodiment.

FIG. 7 shows an illustrative process 700 according to an embodiment. Process 700 can impose a counter based filter on how to handle rapid restarts. In some embodiments, the counter based filter can serve as a first order filter that determines whether to use the rapid restart protection process according to embodiments discussed herein. Process 700 can start at step 702 by maintaining a rapid restart counter in NVM. The rapid restart counter is reset at step 704. Successfully restart determination step 706 may cause the rapid restart counter to be reset if successful restart is detected. Step 706 may be an asynchronous action. At step 708, a determination is made as to whether a restart is detected. An unplanned restart event (step 707) may cause a restart. If the determination at step 708 is YES, the rapid restart counter is incremented at step 710.

At step 712, a determination is made as to whether the rapid restart counter exceeds a first threshold. The first threshold can be a relatively high threshold that, if exceeded, indicates that there is some sort of problem that cannot be resolved by the NVM system. If the first threshold is exceeded, process 700 may commence a failure protocol (step 720). In one embodiment, the failure protocol can include notice instructing the owner to take the device in for service. In another embodiment, the failure protocol can be a take no further action protocol in which the NVM system takes no further action. If the determination at step 712 is NO, process 700 can determine whether the rapid restart counter exceeds a second threshold (step 714). If NO, process 700 may commence the rapid restart protection process (step 730) as previously described above. If YES, process 700 can delay the restart process for a fixed period of time (step 716). The fixed period of time may provide sufficient time for a power issue to resolve itself and thereby prevent additional rapid restarts. After the fixed period of time elapses, process 700 can proceed to step 730.

It should be appreciated that the steps shown in FIG. 7 are merely illustrative and that additional steps may be added, some steps may be omitted, and the order of the steps can be changed.

Many alterations and modifications of the preferred embodiments will no doubt become apparent to a person of ordinary skill in the art after having read the foregoing description, it is to be understood that the particular embodiments shown and described by way of illustration are in no way intended to be considered limiting. Thus, references to the details of the described embodiments are not intended to limit their scope.

What is claimed is:

1. A method for protecting a non-volatile memory (NVM) of a computing device during a rapid restart scenario, the method comprising, at the computing device:
    determining that a current journal of the NVM includes a rapid restart key, wherein the rapid restart key indicates that a prior version of indirection data stored on the NVM has not been updated to a current version of indirection data;
    deleting at least one band that includes at least the current journal and the rapid restart key;
    establishing, within at least one new band of the NVM, the current journal and the rapid restart key;
    attempting to establish, within the at least one new band, the current version of the indirection data based on a prior journal of the NVM and the prior version of indirection data; and
    in response to determining that the current version of the indirection data is established within the at least one new band:
        deleting one or more bands of the NVM that include the prior version of indirection data and the prior journal.

2. The method of claim 1, wherein the at least one band further includes an incomplete copy of the current version of indirection data.

3. The method of claim 1, wherein the at least one band and the at least one new band are:
    distinct from one another, or
    the same as one another.

4. The method of claim 1, further comprising:
    prior to determining that the current journal of the NVM includes the rapid restart key:
        disabling host write transactions; and
        subsequent to deleting the one or more bands of the NVM:
            enabling host write transactions.

5. The method of claim 1, further comprising, in response to determining that the current version of the indirection data is established within the at least one new band:
    writing a flag into current journal to indicate that the prior version of the indirection data has successfully been updated to the current version of the indirection data.

6. The method of claim 1, wherein the indirection data comprises a logical-to-physical mapping of data stored on the NVM.

7. The method of claim 1, wherein the rapid restart scenario is caused by a sudden power failure.

8. The method of claim 1, wherein the prior and current versions of indirection data are separated into a first plurality of silos and a second plurality of silos, respectively.

9. A computing device configured to protect a non-volatile memory (NVM) during a rapid restart scenario, the computing device comprising:
    at least one processor; and
    at least one memory storing instructions that, when executed by the at least one processor, cause the computing device to carry out steps that include:
        determining that a current journal of the NVM includes a rapid restart key, wherein the rapid restart key indicates that a prior version of indirection data stored on the NVM has not been updated to a current version of indirection data;
    deleting at least one band that includes at least the current journal and the rapid restart key;
    establishing, within at least one new band of the NVM, the current journal and the rapid restart key;
    attempting to establish, within the at least one new band, the current version of the indirection data based on a prior journal of the NVM and the prior version of indirection data; and
    in response to determining that the current version of the indirection data is established within the at least one new band:
        deleting one or more bands of the NVM the include the prior version of indirection data and the prior journal.

10. The computing device of claim 9, wherein the at least one band further includes an incomplete copy of the current version of indirection data.

11. The computing device of claim 9, wherein the at least one band and the at least one new band are:
    distinct from one another, or
    the same as one another.

12. The computing device of claim 9, wherein the steps further include:
    prior to determining that the current journal of the NVM includes the rapid restart key:
        disabling host write transactions; and
        subsequent to deleting the one or more bands of the NVM:
            enabling host write transactions.

13. The computing device of claim 9, wherein the steps further include, in response to determining that the current version of the indirection data is established within the at least one new band:
    writing a flag into current journal to indicate that the prior version of the indirection data has successfully been updated to the current version of the indirection data.

14. The computing device of claim 9, wherein the indirection data comprises a logical-to-physical mapping of data stored on the NVM.

15. The computing device of claim 9, wherein the rapid restart scenario is caused by a sudden power failure.

16. The computing device of claim 9, wherein the prior and current versions of indirection data are separated into a first plurality of silos and a second plurality of silos, respectively.

17. A method for protecting a non-volatile memory (NVM) of a computing device during a rapid restart scenario, the method comprising, at the computing device:
resetting a rapid restart counter; and
in response to a restart event:
incrementing the rapid restart counter,
commencing a failure protocol when the rapid restart counter satisfies a first threshold,
starting a rapid restart protection process when the rapid restart counter satisfies neither the first threshold nor a second threshold, and
the rapid restart protection protocol process prevents bricking of the NVM, and
delaying the rapid restart protection process for a fixed period of time when the rapid restart counter does not satisfy the first threshold but satisfies the second threshold, wherein the failure protocol prevents operation of the rapid restart protection process.

18. The method of claim 17, wherein the rapid restart protection process erases all NVM bands written to during an immediately preceding restart process if the immediately preceding restart process was unsuccessful.

19. The method of claim 17, wherein the rapid restart counter is reset in response to a successful restart.

20. The method claim 19, wherein:
the fixed period of time enables a cause of a sudden power failure to resolve, the sudden power failure is responsible for the restart, and
the first threshold is greater than the second threshold.

* * * * *

UNITED STATES PATENT AND TRADEMARK OFFICE
CERTIFICATE OF CORRECTION

| | |
|---|---|
| PATENT NO. | : 11,094,381 B2 |
| APPLICATION NO. | : 16/429021 |
| DATED | : August 17, 2021 |
| INVENTOR(S) | : Muhammad N. Ashraf et al. |

It is certified that error appears in the above-identified patent and that said Letters Patent is hereby corrected as shown below:

In the Claims

In Claim 9, at Column 10, Line 41: "deleting one or more bands of the NVM the include the" should read -- deleting one or more bands of the NVM that include the --.

Signed and Sealed this
Twenty-ninth Day of November, 2022

*Katherine Kelly Vidal*

Katherine Kelly Vidal
*Director of the United States Patent and Trademark Office*